United States Patent
Trumbull

(10) Patent No.: US 12,414,277 B1
(45) Date of Patent: Sep. 9, 2025

(54) PORTABLE ELECTROMAGNETIC SHIELDING ENCLOSURE HAVING A COMPRESSION HATCH POINT OF ENTRY AND ASSOCIATED METHOD(S)

(71) Applicant: Donald W. Trumbull, Salt Springs, FL (US)

(72) Inventor: Donald W. Trumbull, Salt Springs, FL (US)

( * ) Notice: Subject to any disclaimer, the term of this patent is extended or adjusted under 35 U.S.C. 154(b) by 116 days.

(21) Appl. No.: 18/431,939

(22) Filed: Feb. 3, 2024

Related U.S. Application Data

(60) Provisional application No. 63/483,078, filed on Feb. 3, 2023.

(51) Int. Cl.
*H05K 9/00* (2006.01)

(52) U.S. Cl.
CPC ......... *H05K 9/0015* (2013.01); *H05K 9/0049* (2013.01)

(58) Field of Classification Search
CPC ........................... H05K 9/0049; H05K 9/0015
See application file for complete search history.

(56) References Cited

U.S. PATENT DOCUMENTS

| | | | | |
|---|---|---|---|---|
| 4,399,318 | A * | 8/1983 | Waters | H01R 13/6592 |
| | | | | 174/359 |
| 4,831,211 | A * | 5/1989 | McPherson | H05K 9/0049 |
| | | | | 174/371 |
| 6,297,969 | B1 * | 10/2001 | Mottahed | H05K 9/0045 |
| | | | | 361/752 |
| 8,530,756 | B1 * | 9/2013 | Winch | H05K 9/0001 |
| | | | | 174/382 |
| 11,071,233 | B1 * | 7/2021 | Robert | H05K 9/0049 |
| 2021/0153340 | A1 * | 5/2021 | Lee | H05K 7/20445 |
| 2023/0032158 | A1 * | 2/2023 | Ulmer | H05K 5/061 |
| 2024/0258004 | A1 * | 8/2024 | Yoshida | H05K 9/0049 |

* cited by examiner

*Primary Examiner* — Hung V Ngo
(74) *Attorney, Agent, or Firm* — Ashkan Najafi

(57) ABSTRACT

An electromagnetic shielding enclosure includes an inner shielded housing having an open point of entry (POE) chamber. A compression hatch assembly is operably coupled to the inner shielded housing. An outer casing is situated about the inner shielded housing and is affixed to a bottom plate, and a plurality of compression pins are frictionally and removably abutted with the compression hatch assembly and the outer casing. The compression pins are configured to evenly distribute external forces against a metal flange and the compression hatch assembly within the POE chamber after the compression hatch assembly is closed and the compression pins are rotated A stowed tool and lock affix the compression pins to the enclosure and prevent the compression pins from undesirable displacement.

18 Claims, 11 Drawing Sheets

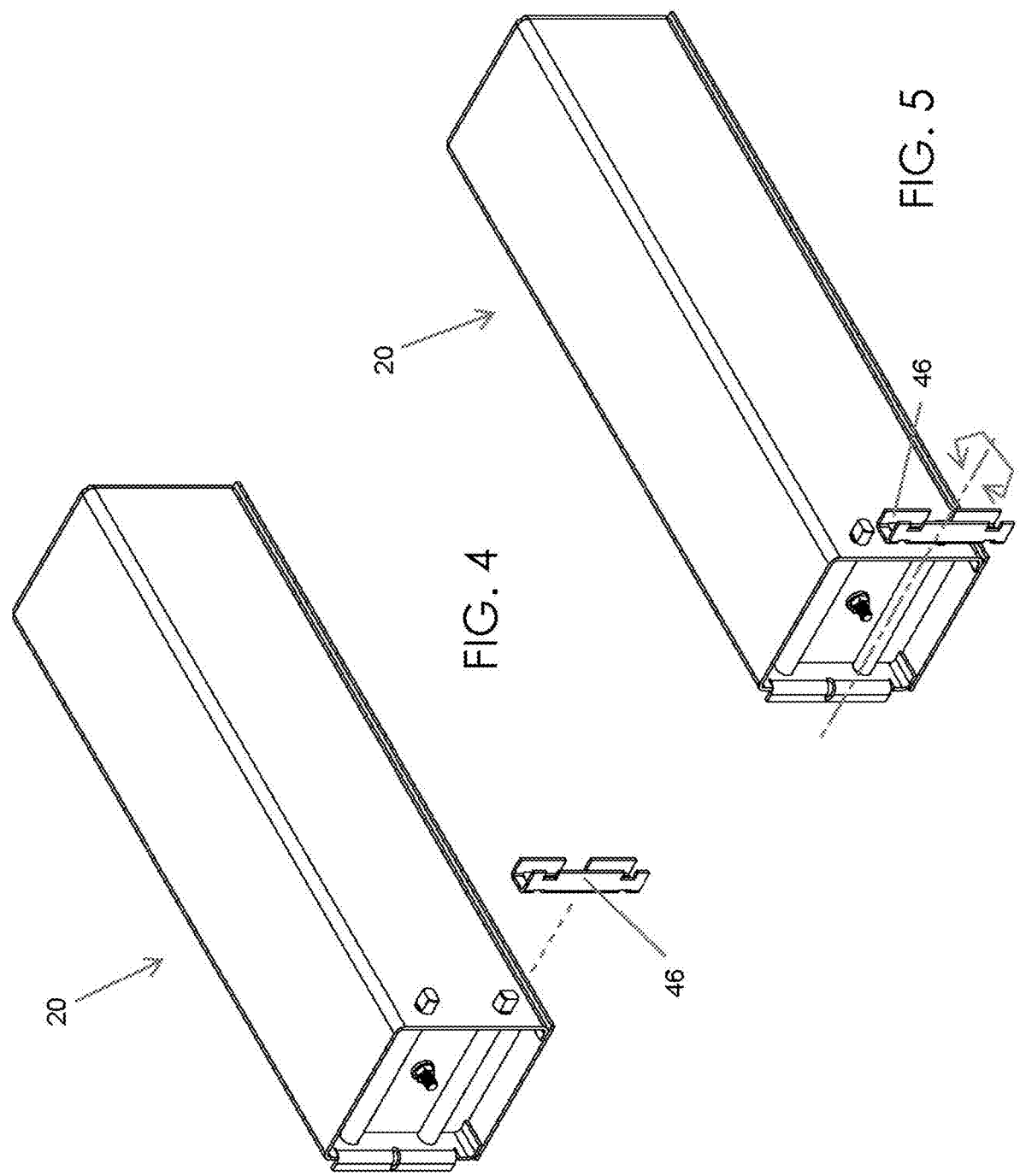

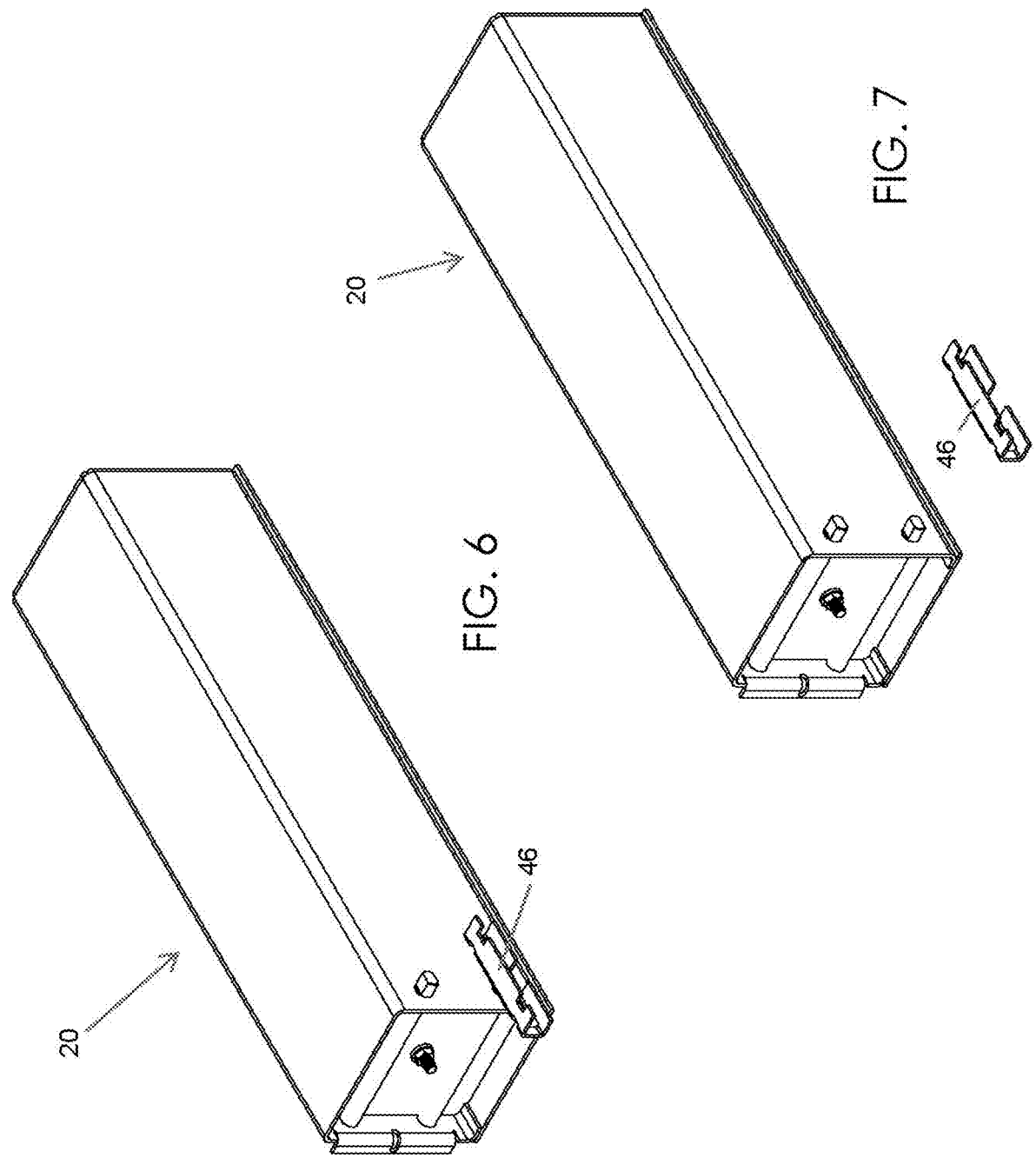

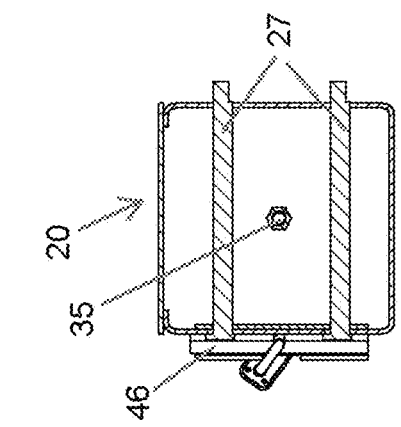
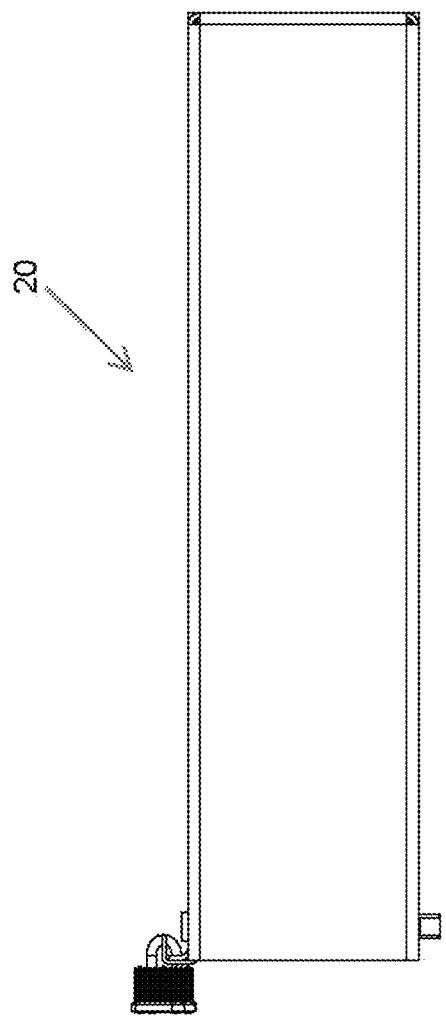
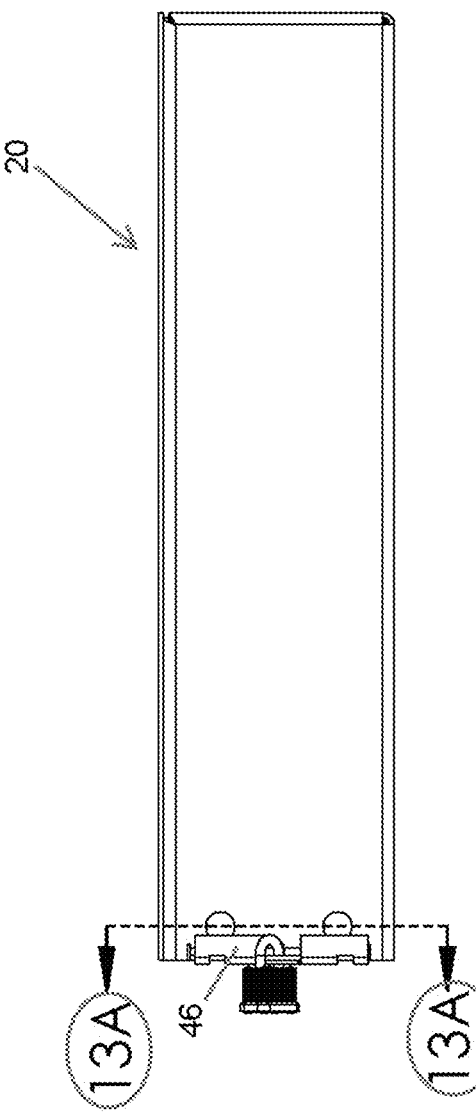

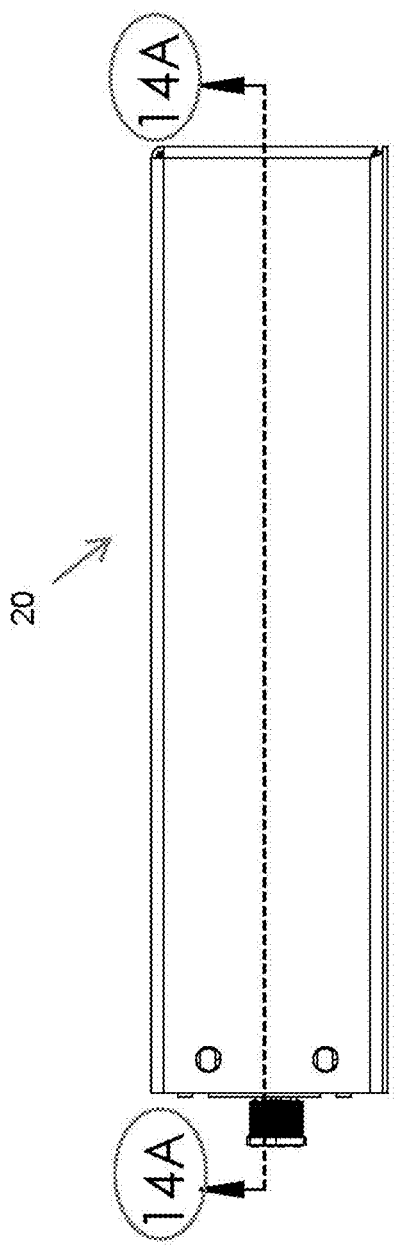
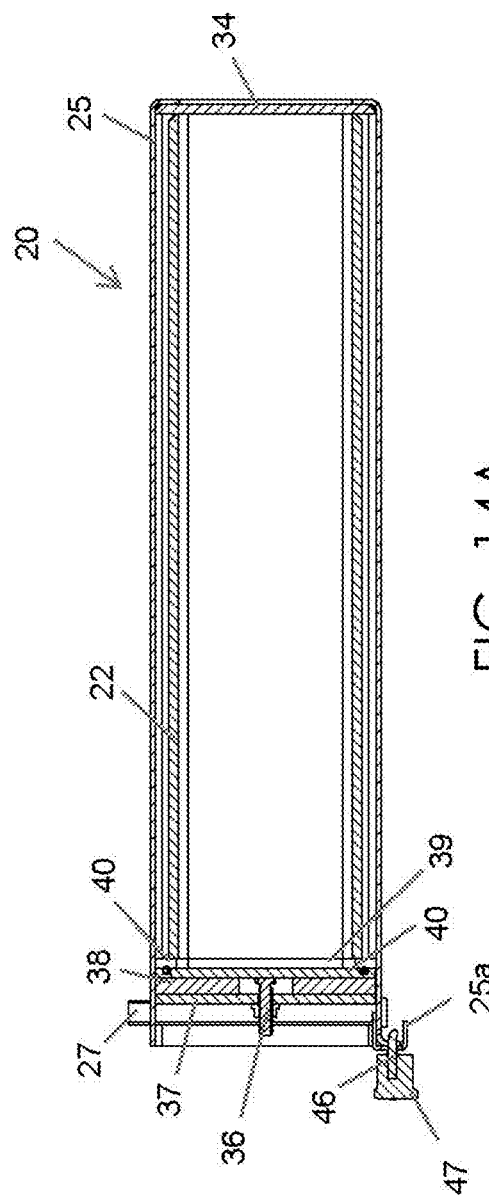
FIG. 14
FIG. 14A

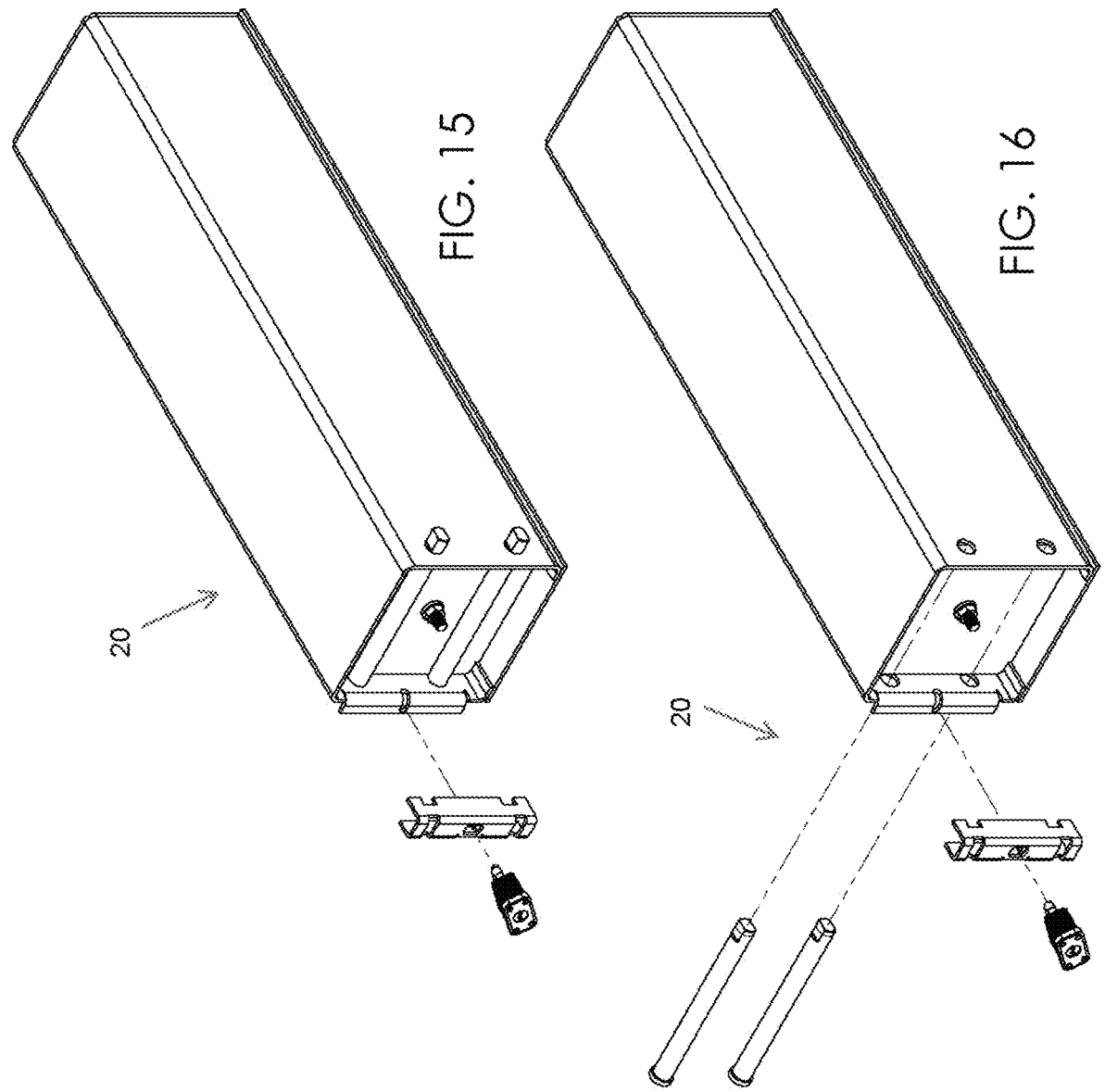

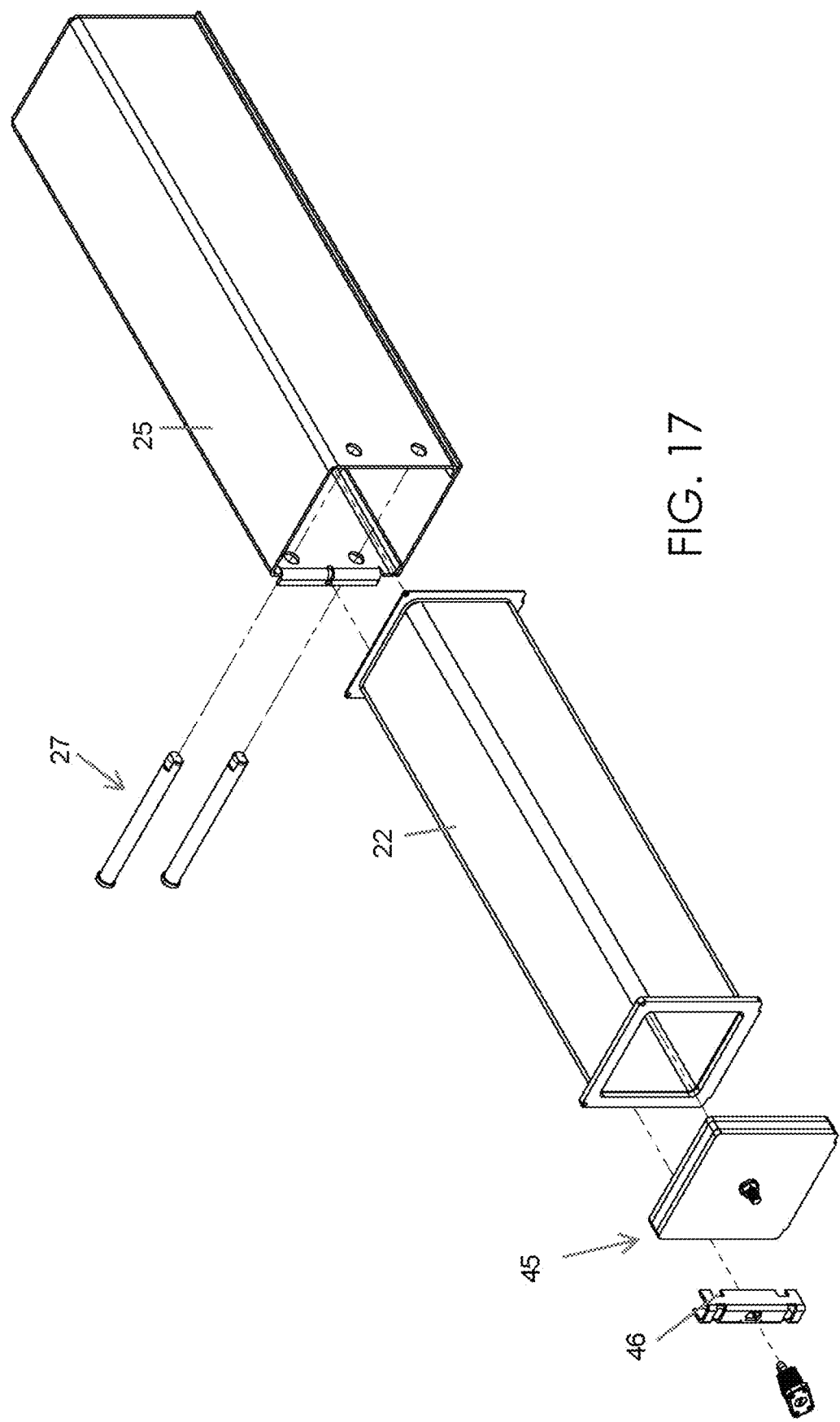

PORTABLE ELECTROMAGNETIC SHIELDING ENCLOSURE HAVING A COMPRESSION HATCH POINT OF ENTRY AND ASSOCIATED METHOD(S)

CROSS REFERENCE TO RELATED APPLICATIONS

This is a non-provisional patent application that claims priority to and benefit of U.S. provisional patent application No. 63/483,078 filed Feb. 3, 2023, which is incorporated by reference herein in its entirety.

STATEMENT REGARDING FEDERALLY SPONSORED RESEARCH OR DEVELOPMENT

Not Applicable.

REFERENCE TO A MICROFICHE APPENDIX

Not Applicable.

BACKGROUND

Technical Field

Exemplary embodiment(s) of the present disclosure relate to faraday cages and, more particularly, to a specially configured electromagnetic shielding enclosure having a high shielding effectiveness (SE) value and being provided with a removable compression hatch assembly, having an electromagnetically insulated (EMI) gasket, located at a point of entry (POE) of an inner housing of the enclosure.

Prior Art

As the proliferation and risk of electromagnetic pulse/high altitude electromagnetic pulse/intentional electromagnetic interference (EMP/HEMP/IEMI) weapons designed to compromise or destroy unshielded critical electronics and critical infrastructures continues at a rapid pace, and the proliferation of radiofrequency generating devices continues at a rapid pace, there is an ongoing and growing need to effectively shield objects from both destructive and unwanted electromagnetic radiation for various purposes. For example, certain electronics will be destroyed/rendered inoperative if exposed to high amplitude EMP/IEMP/IEMI frequencies. Additionally, certain electronic equipment requires an electromagnetically "quiet" environment to function properly. Such equipment includes, for example, some medical diagnostic and imaging equipment. In addition, testing of electronic equipment often requires a similar electromagnetically "quiet" environment.

Any point of entry (POE) of a shielding enclosure, where access to the interior is inherently required, the POE is the weak link of all Faraday cage enclosures due to the structural challenges associated with ensuring an ongoing and reliable electrically conductive seal to the other five sides when the point of entry is closed. Furthermore, when the enclosure is moved, or when the enclosure is transported within the rugged or unstable environment, this weak link associated with its POE is further challenged to maintain an ongoing and reliable electrically conductive seal to the other five sides of an enclosure while the enclosure is under stress or disturbed. In some situations, there is the need to prevent radiofrequencies from leaving a confined physical area. Such situations include, for example, the use of computer and military electronics where there is the risk of unwanted detection of a radiated radiofrequency signal or unwanted detection of the associated harmonics and signature of radiofrequency activity. In all cases, whether static or dynamic, the shielding enclosure's weak link is its POE.

Further, testing such as electromagnetic compatibility/electromagnetic interference (EMC) testing requires the monitoring of electromagnetic energy released from a device under test in a controlled environment where there are little or no outside sources of electromagnetic radiation that could interfere with the monitoring of the device under test. Such testing may also include subjecting a device under test to external electromagnetic energy and monitoring the impact of this external electromagnetic energy on the proper functioning of the device under test.

With the advent of metallized fabrics and textiles, including solid aluminum metal, lightweight shielded tents and other portable enclosures are readily available today. However, while these enclosures are essentially a Faraday Cage where electromagnetic signals should not pass, many of these lightweight materials used to construct shielding enclosures, such as metalized fabrics and textiles, including solid aluminum, and due to their low permeability and low-confidence POE design limitations, fail to shield the interior and reduce the attenuation in decibels (dB) in both the electric and magnetic fields to a survivable level with respect to EMP/IEMP/IEMI. In addition to the deficient POE design limitations and lessor shielding effectiveness of these lightweight materials, both lightweight materials and higher shielding effectiveness materials such as solid steel and copper with higher permeability, when fragile or inferior point of entry (POE) designs are incorporated into the shielding enclosure, the risk of an ongoing failure to maintain a reliable RF (radiofrequency) tight seal at the seams surrounding the point of entry (POE) perimeter exists when the enclosure is subjected to any movement.

Such enclosures come in many shapes and sizes and are available from various manufacturers. While such enclosures are available, the shielding effectiveness of metalized fabric and textiles, including solid aluminum, solid steel, and solid copper, are all subject to insufficient shielding effectiveness when defending threats from high-amplitude EMP/HEMP/IEMI in the unstable environment. Without a point of entry (POE) capable of maintaining continual perimeter compression in the unstable environment, radiofrequency leakage at enclosure seams and/or points of entry (POE) will likely occur when the enclosure is disturbed. As such, the overall material, design, and construction of a portable electromagnetically shielded enclosure and point of entry (POE) is vital to both the performance and reliability of the shielded enclosure. For EMP/HEMP, the U.S Army Corps of Engineers recommends solid steel with a general thickness of ¼" for enclosures. For points of entry (POE), multiple bolt fasteners spaced closely together, or other methods which compress the POE at its perimeter and maintain continual perimeter continuity is required. For unstable environments where the enclosure is subjected to movement and/or vibration, a suitable POE design is intrinsically required.

In addition, larger enclosures, such as those with man-size doors and larger POE's often use an exterior compression apparatus which incorporates a high cost, high weight, electrically driven, air bladder or pneumatic mechanisms to compress the entire circumference of a POE against a door flange and EMI gasket. Some large door POE's will use a mechanical compression system using latches that are only usable in the static/upright/stable environment. This large door compression method is only suitable for fixed/non-portable enclosures in the static environment due to the limiting mechanical design, high weight, and associated exterior power source (electricity, pneumatics, hydraulic, air bladder, etc.).

Conventional shielding devices of the portable size have been bound to a lessor shielding effectiveness integrity due to the use of fasteners and/or clamps to compress a POE against a flange at specific clamping points around the circumference of POE. Fasteners (screws/bolts) and clamps that are used to achieve the same maximum shielding effectiveness of larger, more complex POE compression mechanisms must be equally and closely spaced (1-2 inches apart). If the POE fasteners/clamps are not consistently torqued accurately, or if the spacing of fasteners/clamps is deficient, uneven compression of the POE will degrade shielding effectiveness significantly. Additionally, those POE designs using multiple fasteners and/or clamps are bound to the static environment where movement and/or vibration may degrade clamping force and nullify the shielding effectiveness of enclosure. These competing devices require fasteners/clamps at closely spaced intervals around the circumference of the POE, also require peripheral tools, trained personnel, and/or cumbersome procedures to open/close the POE.

As noted above, such large man-sized door POE and those made for certain large-scale civilian/military HEMP installations exist, wherein the POE seal is equally compressed around its circumference via electric, pneumatic, air bladder, hydraulic, or other systems. However, such conventional POE compression devices have high costs and are highly complex. While they have been widely used in the larger fixed-base/non-portable enclosure market, these large scale devices are unusable in the small, portable enclosure market due to weight, size, complexity, and cost.

With the various requirements for electromagnetically shielded enclosures, and more particularly, with respect to defending against the destructive threats of EMP/IEMP/IEMI, there exists a need to make these enclosures portable, low cost, rugged, rapidly deployable within a stable and unstable environment, constructed out of solid metal with magnetic properties such as steel or copper, and designed with a high confidence point of entry (POE) system that achieves sufficient, ongoing, and reliable shielding effectiveness (SE) capable of attenuating the destructive frequencies associated with EMP/IHEMP/IEMI to a survivable level within the unstable environment.

Accordingly, a need remains for a specially configured portable electromagnetic shielding enclosure to overcome at least one of the above-noted shortcomings. The exemplary embodiment(s) satisfy such a need by a specially configured portable, steel, electromagnetic shielding enclosure that is convenient and easy to use, lightweight yet durable in design, versatile in its applications, and structurally configured to provide (1) an ergonomic, on-demand, reliable ingress/egress access of the POE in the field by untrained personnel, (2) superior continual perimeter compression of POE against its metal flange/EMI gasket in both the static and unstable environment, and (3) superior shielding effectiveness reliability to an interior of the enclosure when subjected to movement within the unstable environment and/or repeated opening/closing a compression hatch point of entry (POE) in the field.

BRIEF SUMMARY OF NON-LIMITING EXEMPLARY EMBODIMENT(S) OF THE PRESENT DISCLOSURE

In view of the foregoing background, it is therefore an object of the non-limiting exemplary embodiment(s) to provide a specially configured portable or stationary, high shielding effectiveness (SE) electromagnetic shielding enclosure for providing ergonomic, on-demand, reliable ingress/egress of point of entry (POE) in the field by untrained personnel, superior continual perimeter compression of POE against its metal flange/electromagnetically insulated (EMI) gasket in both a static and an unstable environment, and superior shielding effectiveness reliability to an interior of the enclosure when subjected to movement within the unstable environment and/or repeated opening/closing of a compression hatch point of entry (POE) in the field. These and other objects, features, and advantages of the non-limiting exemplary embodiment(s) are provided by a portable electromagnetic shielding enclosure for providing even distribution of seal forces. The portable electromagnetic shielding enclosure includes a portable inner shielded housing having an open point of entry. Such an enclosure further includes a compression hatch assembly operably coupled to the open point of entry and being configured to electromagnetically seal the open point of entry, a portable bottom plate and a portable outer casing affixed to the portable bottom plate and being configured to define a chamber configured to linearly receive the portable inner shielded housing, and a plurality of compression pins frictionally and removably abutted with the compression hatch assembly and the portable outer casing. Advantageously, the compression hatch assembly and the portable inner shielded housing are axially reciprocated, along a bi-directional travel path, into and out from the chamber. Advantageously, the compression pins are configured to evenly distribute external forces against the compression hatch assembly operably engaged with the open point of entry after the compression hatch assembly is closed and locked from its open and manually pre-compressed position.

In a non-limiting exemplary embodiment, the portable inner shielded housing further includes a rear side, an axial bore, a flange disposed about the axial bore at an outer perimeter of the open point of entry, and a rear plate attached to the rear side. Advantageously, the compression hatch assembly is operably engaged with the flange and axially opposed from the rear plate.

In a non-limiting exemplary embodiment, the compression hatch assembly includes a preset nut and a fastener operably coupled thereto, a front compression plate operably coupled to the preset nut, a compressible foam layer directly engaged with the front compression plate, a back stainless steel end cap (rear compression plate) directly engaged with the compressible foam layer and the fastener, and an electromagnetically insulated (EMI) gasket directly engaged with the back stainless steel end cap (rear compression plate) and the flange. Advantageously, the pre-set nut and the fastener are configured to establish a fixed, pre-harnessed compression state suitable for the compression hatch assembly to operably and electromagnetically seal the point of entry. Advantageously, the compression hatch assembly and the portable inner shielded housing are further configured to be contemporaneously inserted into the portable outer casing.

In a non-limiting exemplary embodiment, the portable electromagnetic shielding enclosure further includes a stowable tool removably engaged with the compression pins as well as the portable outer casing, and a lock detachably engaged with the stowable tool and the portable outer casing.

In a non-limiting exemplary embodiment, the stowable tool and the lock are located exterior of the portable inner shielded housing and the portable outer casing.

In a non-limiting exemplary embodiment, the compression pins include a plurality of generally D-shaped compression pins configured to roll and transfer opposing forces that compresses the EMI gasket against the flange along an entirety of the outer perimeter of the point of entry at the portable inner shielded housing.

In a non-limiting exemplary embodiment, the portable electromagnetic shielding enclosure further includes a rotating handle operably engaged with the pre-set nut.

In a non-limiting exemplary embodiment, the rotating handle is configured to be rotated in opposed rotational directions to respectively tighten and loosen the pre-set nut and further configured to enable the compression hatch assembly to be inserted into the chamber.

In a non-limiting exemplary embodiment, the compression hatch assembly, the portable inner shielded housing, and the portable outer casing are coaxially aligned.

There has thus been outlined, rather broadly, the more important features of non-limiting exemplary embodiment(s) of the present disclosure so that the following detailed description may be better understood, and that the present contribution to the relevant art(s) may be better appreciated. There are additional features of the non-limiting exemplary embodiment(s) of the present disclosure that will be described hereinafter and which will form the subject matter of the claims appended hereto.

BRIEF DESCRIPTION OF THE NON-LIMITING EXEMPLARY DRAWINGS

The novel features believed to be characteristic of non-limiting exemplary embodiment(s) of the present disclosure are set forth with particularity in the appended claims. The non-limiting exemplary embodiment(s) of the present disclosure itself, however, both as to its organization and method of operation, together with further objects and advantages thereof, may best be understood by reference to the following description taken in connection with the accompanying drawings in which:

FIG. 4 is a perspective view of the electromagnetic shielding enclosure shown in FIG. 1 wherein the stowable tool is removed from the stowed position;

FIG. 5 is a perspective view of the electromagnetic shielding enclosure shown in FIG. 1 wherein the stowable tool is operably and rotatably engaged with the unlocked generally D-shaped compression pin;

FIG. 6 is a perspective view of the electromagnetic shielding enclosure shown in FIG. 1 wherein the stowable tool operably and rotatably locks the generally D-shaped compression pin;

FIG. 7 is a perspective view of the electromagnetic shielding enclosure shown in FIG. 1 wherein the stowable tool is removed from the locked generally D-shaped compression pin;

FIG. 12 is a top plan view of the electromagnetic shielding enclosure shown in FIG. 1;

FIG. 13 is a left side elevational view of the electromagnetic shielding enclosure shown in FIG. 1;

FIG. 13A is a cross-sectional view taken along line 13A-13A in FIG. 13;

FIG. 14 is a right side elevational view of the electromagnetic shielding enclosure shown in FIG. 1;

FIG. 14A is a cross-sectional view taken along line 14A-14A in FIG. 14;

FIG. 15 is a partially exploded view of the electromagnetic shielding enclosure shown in FIG. 1 wherein the stowable tool and lock are removed from the enclosure;

FIG. 16 is another partially exploded view of the electromagnetic shielding enclosure shown in FIG. 1 wherein the stowable tool, lock, and generally D-shaped compression pins are removed from the enclosure;

FIG. 17 is another partially exploded view of the electromagnetic shielding enclosure shown in FIG. 1 wherein the stowable tool, lock, generally D-shaped compression pins, compression hatch assembly, and shielded inner housing are removed from the outer casing;

Figure 19:
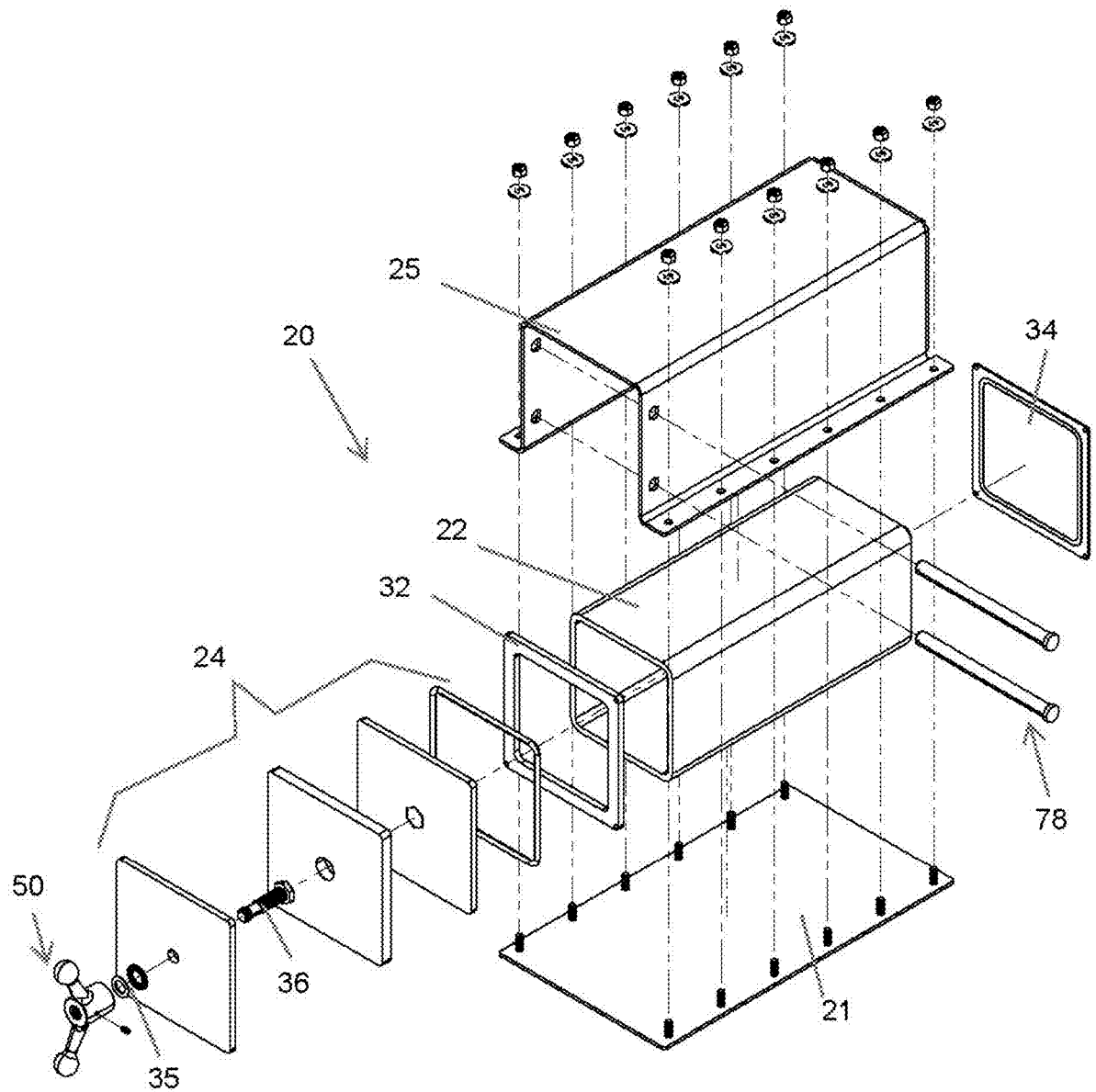
Figure 20:
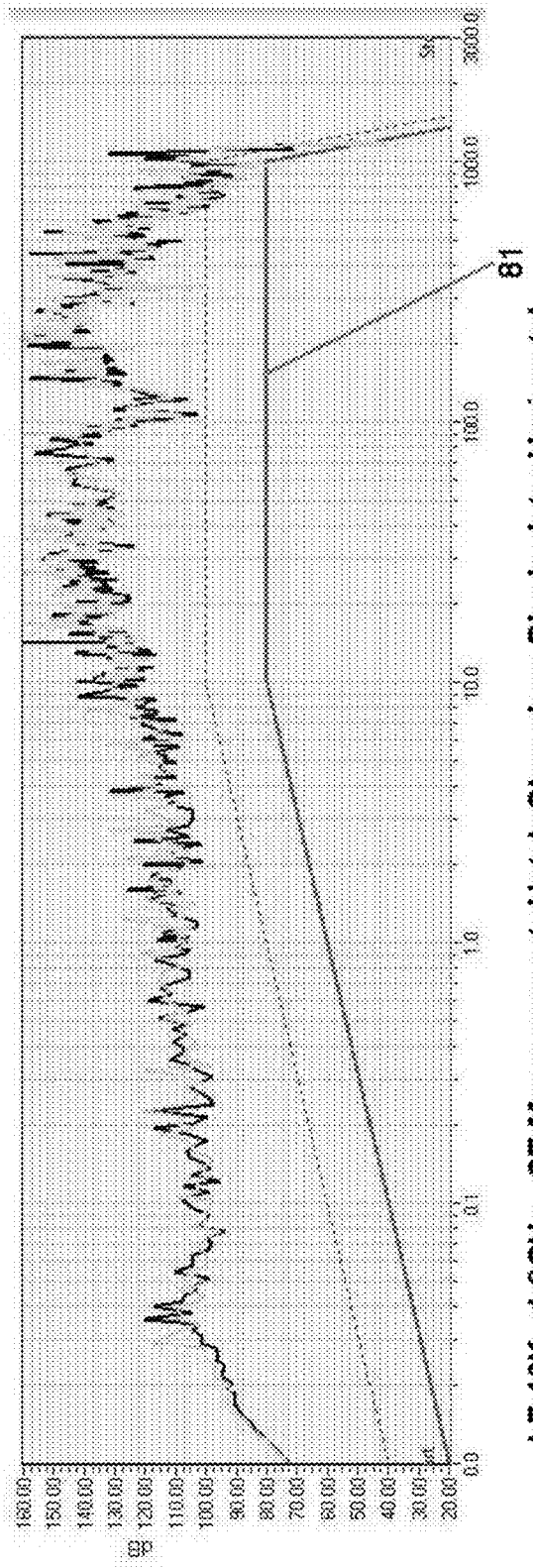

FIG. 19 is an exploded view of another electromagnetic shielding enclosure having a compression hatch point of entry employing a rotating compression wheel, in accordance with another non-limiting exemplary embodiment of the present disclosure; and FIG. 20 is a graph illustrating test results from the Boeing Little Mountain Test Facility (LMTF) showing the shielding effectiveness (SE) of the electromagnetic shielding enclosure's POE shown in FIGS. 1-18. This test result confirms the shielding enclosure's POE exceeds the SE standards of MIL-STD-188-125-1.

Those skilled in the art will appreciate that the figures are not intended to be drawn to any particular scale; nor are the figures intended to illustrate every non-limiting exemplary embodiment(s) of the present disclosure. The present disclosure is not limited to any particular non-limiting exemplary embodiment(s) depicted in the figures nor the shapes, relative sizes or proportions shown in the figures.

DETAILED DESCRIPTION OF NON-LIMITING EXEMPLARY EMBODIMENT(S) OF THE PRESENT DISCLOSURE

The present disclosure will now be described more fully hereinafter with reference to the accompanying drawings, in which non-limiting exemplary embodiment(s) of the present disclosure is shown. The present disclosure may, however, be embodied in many different forms and should not be construed as limited to the non-limiting exemplary embodiment(s) set forth herein. Rather, such non-limiting exemplary embodiment(s) are provided so that this application will be thorough and complete and will fully convey the true spirit and scope of the present disclosure to those skilled in the relevant art(s). Like numbers refer to like elements throughout the figures.

The illustrations of the non-limiting exemplary embodiment(s) described herein are intended to provide a general understanding of the structure of the present disclosure. The illustrations are not intended to serve as a complete description of all of the elements and features of the structures, systems and/or methods described herein. Other non-limiting exemplary embodiment(s) may be apparent to those of ordinary skill in the relevant art(s) upon reviewing the disclosure. Other non-limiting exemplary embodiment(s) may be utilized and derived from the disclosure such that structural, logical substitutions and changes may be made without departing from the true spirit and scope of the present disclosure. Additionally, the illustrations are merely representational and are to be regarded as illustrative rather than restrictive.

One or more embodiment(s) of the disclosure may be referred to herein, individually and/or collectively, by the term "non-limiting exemplary embodiment(s)" merely for convenience and without intending to voluntarily limit the true spirit and scope of this application to any particular non-limiting exemplary embodiment(s) or inventive concept. Moreover, although specific embodiment(s) have been illustrated and described herein, it should be appreciated that any subsequent arrangement designed to achieve the same or similar purpose may be substituted for the specific embodiment(s) shown. This disclosure is intended to cover all subsequent adaptations or variations of other embodiment(s). Combinations of the above embodiment(s), and other embodiment(s) not specifically described herein, will be apparent to those of skill in the relevant art(s) upon reviewing the description.

References in the specification to "one embodiment(s)", "an embodiment(s)", "a preferred embodiment(s)", "an alternative embodiment(s)" and similar phrases mean that a particular feature, structure, or characteristic described in connection with the embodiment(s) is included in at least an embodiment(s) of the non-limiting exemplary embodiment(s). The appearances of the phrase "non-limiting exemplary embodiment" in various places in the specification are not necessarily all meant to refer to the same embodiment(s).

Directional and/or relationary terms such as, but not limited to, left, right, nadir, apex, top, bottom, vertical, horizontal, back, front and lateral are relative to each other and are dependent on the specific orientation of an applicable element or article, and are used accordingly to aid in the description of the various embodiment(s) and are not necessarily intended to be construed as limiting.

If used herein, "about," "generally," and "approximately" mean nearly and in the context of a numerical value or range set forth means±15% of the numerical.

If used herein, "substantially" means largely if not wholly that which is specified but so close that the difference is insignificant.

The term "generally D-shaped compression pin" means a compression pin having a generally D-shaped cross-section having a flat (planar) side and a curvilinear (arcuate) side opposed therefrom.

The non-limiting exemplary embodiment(s) is/are referred to generally in FIGS. 1-20 and is/are intended to a non-limiting exemplary embodiment(s) of the present disclosure is referred to generally in the figures and is intended to provide a specially configured portable electromagnetic shielding enclosure 20, made of steel, meeting or exceeding minimum standards outlined in U.S. military's high-altitude electromagnetic pulse (HEMP) protection for ground-based facilities performing critical, time-urgent missions (MIL-STD-188-125), and providing ergonomic, on-demand, reliable ingress/egress access of POE 23 in the field by untrained personnel, superior continual perimeter compression of POE 23 against its metal flange 32/EMI gasket 40 in both the static and unstable environment, and superior shielding effectiveness reliability to an interior of the enclosure 20 when subjected to movement within an unstable environment and/or repeated opening/closing a compression hatch point of entry 23 (POE) in the field. It should be understood that the exemplary embodiment(s) may be used to shield a variety of electromagnetic signals and should not be limited to any particular electromagnetic signal having a specific wavelength described herein. The present disclosure may be commercially marketed by the trademark FARASA-FE.TM.TM, or another trademark.

Referring to FIGS. 1-20 in general, a specially configured portable or stationary electromagnetic shielding enclosure 20 for providing high shielding effectiveness (SE), ergonomic, on-demand, reliable ingress/egress of point of entry 23 (POE) in the field by untrained personnel, superior continual perimeter compression of POE 23 against its metal flange 32/EMI gasket 40 in both the static and unstable environment, and superior shielding effectiveness reliability to an interior of the enclosure 20 when subjected to movement within an unstable environment and/or repeated opening/closing of a compression hatch point of entry 23 (POE) in the field. Advantageously, the compression pins 27 are configured to evenly distribute external forces against the metal flange 32/EMI gasket 40 within the point of entry 23 (POE) chamber 26 after the compression hatch assembly 24 is closed and second independent compression mechanism is activated (via the handwheel or rotating of the generally D-shaped compression pins 27), and whereby the opposing forces are transferred within the POE 23 chamber 26 from its open, pre-compressed position 45 obtained via the first independent compression mechanism established by handwheel or pre-set nut 35.

The portable electromagnetic shielding enclosure 20 provides even distribution of seal forces. Such a portable electromagnetic shielding enclosure 20 includes and a portable inner shielded housing 22 having an open point of entry 23. Such an enclosure 20 further includes a compression hatch assembly 24 operably coupled to the open point of entry 23 and being configured to electromagnetically seal the open point of entry 23, a portable bottom plate 21 and a portable outer casing 25 affixed to the portable bottom plate 21 and being configured to define a chamber 26 configured to linearly receive the portable inner shielded housing 22, and a plurality of compression pins 27 frictionally and removably abutted with the compression hatch assembly 24 and the portable outer casing 25. Advantageously, the compression hatch assembly 24 and the portable inner shielded housing 22 are axially reciprocated, along a bi-directional travel path 28, into and out from the chamber 26. Advantageously, the compression pins 27 are configured to evenly distribute external forces against the compression hatch assembly 24 operably engaged with the open point of entry 23 after the compression hatch assembly 24 is closed and locked from its open and manually pre-compressed position 45.

In a non-limiting exemplary embodiment, the portable inner shielded housing 22 further includes a rear side 30, an axial bore 31, a flange 32 disposed about the axial bore 31 at an outer perimeter 33 of the open point of entry 23, and a rear plate 34 attached to the rear side 30. Advantageously, the compression hatch assembly 24 is operably engaged with the flange 32 and axially opposed from the rear plate 34.

In a non-limiting exemplary embodiment, the compression hatch assembly 24 includes a preset nut 35 and a fastener 36 operably coupled thereto, a front compression plate 37 operably coupled to the preset nut 35, a compressible foam layer 38 directly engaged with the front compression plate 37, a back stainless steel end cap (rear compression plate) 39 directly engaged with the compressible foam layer 38 and the fastener 36, and an electromagnetically insulated (EMI) gasket 40 directly engaged with the back stainless steel end cap (rear compression plate) 39 and the flange 32. The EMI gasket 40 may be made of silicon, copper, and silver. Advantageously, the pre-set nut 35 and the fastener 36 are configured to establish a fixed, pre-harnessed compression state 45 suitable for the compression hatch assembly 24 to operably and electromagnetically seal the point of entry 23. Advantageously, the compression hatch assembly 24 and the portable inner shielded housing 22 are further configured to be contemporaneously inserted into the portable outer casing 25.

In a non-limiting exemplary embodiment, the portable electromagnetic shielding enclosure 20 further includes a stowable tool 46 removably engaged with the compression pins 27 as well as the portable outer casing 25, and a lock 47 detachably engaged with the stowable tool 46 and the portable outer casing 25. A shoulder 25a of the portable outer casing 25 has an opening 25b for securing the tool thereto via lock 47.

In a non-limiting exemplary embodiment, the stowable tool 46 and the lock 47 are located exterior of the portable inner shielded housing 22 and the portable outer casing 25.

In a non-limiting exemplary embodiment, the compression pins 27 include a plurality of generally D-shaped compression pins 27 configured to roll and transfer opposing forces that compresses the EMI gasket 40 against the flange 32 along an entirety of the outer perimeter 33 of the point of entry 23 at the portable inner shielded housing 22.

In a non-limiting exemplary embodiment, the portable electromagnetic shielding enclosure 20 further includes a rotating handle 50 operably engaged with the pre-set nut 35.

In a non-limiting exemplary embodiment, the rotating handle 50 is configured to be rotated in opposed rotational directions to respectively tighten and loosen the pre-set nut 35 and further configured to enable the compression hatch assembly 24 to be inserted into the chamber 26.

In a non-limiting exemplary embodiment, the compression hatch assembly 24, the portable inner shielded housing 22, and the portable outer casing 25 are coaxially aligned.

In a non-limiting exemplary embodiment, each generally D-shaped compression pin 27 has a planar (flat) side 27a and a curvilinear (arcuate) side 27b. When the planar (flat) side 27a faces the compression hatch assembly 24, the compression hatch assembly 24 is not at a final compressed state. When the curvilinear (arcuate) side 27b faces and abuts against the compression hatch assembly 24, the compression hatch assembly 24 is at a final compressed state. The same structural configuration is associated with pins 78 in the embodiment of FIG. 19.

Referring to FIGS. 1-20 in general, in a non-limiting exemplary embodiment(s), the electromagnetic shielding enclosure 20 includes an outer casing 25, independent (separable) of the inner shielded enclosure 20 and used to perform an independent compression function, and a POE end cap (rear compression plate) 39 with a machined groove to receive an EMI gasket 40, which may include aluminum and steel, respectively, or other suitable materials for preventing electromagnetic signals from passing through the end cap (rear compression plate) 39 and into the interior of the inner shielded enclosure 20. Advantageously, a compression hatch assembly 24 is detachably affixed to the interior shield housing 22 and enables the transfer of opposing forces between two separate and independent compression mechanisms (e.g., pre-set nut 35/fastener 36 and generally D-shaped compression pins 27). In particular, the compression hatch assembly 24 includes a compression foam layer 38 or compression material serving as a spring with compression force deflection (CFD) sandwiched between two steel plates 37, 39, which is then pre-compressed via the pre-set nut 35 and associated fastener 36 manual (with or without the handwheel 50) for minute adjustment or set at a fixed pre-compressed position 45 with a pre-set adjustment (by tightening/loosening the pre-set nut 35/fastener 36) so that it can be inserted within the outer casing 25 after being loaded against the steel flange 32 that is welded to the inner steel shielded housing 22, which is removably positioned within the outer casing 25. When pre-compressed (with or without manual handwheel 50) for minuet adjustment of pre-set nut 35 for pre-set adjustment, the compression hatch assembly 24 can be positioned within chamber 26 created by the outer casing 25 at a specific depth just beyond a plurality of apertures 58 for receiving the associated generally D-shaped compression pins 27 (clevis pins). These generally D-shaped compression pins 27 have generally D-shaped cross-sections depending on whether manual handwheel 50 or pre-set nut 35 is used for securing depth adjustment for placement of the compression hatch assembly 24 into chamber 26 created by outer casing 25. When these generally D-shaped compression pins 27 (stop/clevis pins) are inserted into apertures 58, the second independent compression mechanism can then be activated by rotatably engaging tool 46 with generally D-shaped compression pins 27 so that a desired compression force is maintained at the POE 23 (or by rotatably loosening handwheel 50). The offset and non-concentric generally D-shaped cross-section of the compression pins 27 enables the increased compression force to be maintained at the POE 23. Advantageously, such a structural configuration yields a new, useful, and unexpected rugged, on-demand, rapidly deployable enclosure 20 with a POE 23 designed to withstand the unstable environment associated with land vehicles and other mission requirements existing in the field, and additionally, designed for repeated open/close cycles without the need for trained personnel, exterior tools, inferior fasteners, or inferior clamps.

In a non-limiting exemplary embodiment, after tightening the pre-compressed hatch assembly 24 (e.g., a power tool is used to pre-tighten the pre-set nut 35 and fastener 36), the compression force is transferred to and maintained by the generally D-shaped compression pins 27 by rotating such pins 27 in an associated rotational direction via tool 46. Thus, the first compression mechanism includes the pre-set nut 35 and associated fastener 36, and the second compression mechanism includes the generally D-shaped compression pins 27, which are rotatably activated after being inserted into the apertures 58 of outer casing 25, and subsequent release of the first compression mechanism (via a hydraulic/pneumatic tool) by way of rotatably unwinding the pre-set nut 35 and fastener 36 (with or without the handwheel 50). Rotating (rotating) non-concentric generally D-shaped compression pins 27, which then captures the pre-compressed compression hatch assembly 24 contained in the first compression mechanism and transfers the opposing forces between the generally D-shaped compression pins 27 and the steel flange 32 of inner shielded housing 22.

In a non-limiting exemplary embodiment, the electromagnetic shielding enclosure 20 has a portable, heavy-duty six-sided steel outer casing 25 including a compression hatch assembly 24 located at the POE 23. The electromagnetic shielding enclosure 20 provides portable, rugged, high confidence shielding of critical electronics from electromagnetic pulses (EMP), high-altitude EMP (HEMP), and intentional electromagnetic interference (IEMI) via a versatile, low-cost structural configuration that achieves continual POE 23 shielding effectiveness (SE) within both static and unstable environments, exceeds the shielding effectiveness established by MIL-STD-188-125-1A, and removes the need for cumbersome fasteners or electric/pneumatic/auxiliary compression components.

In a non-limiting exemplary embodiment, the electromagnetic shielding enclosure 20 is built in accordance with specific military standards (MIL-STD-188-125-1A), which includes a five-sided one-quarter inch steel outer casing 25 with an open sixth side dedicated as the point of entry 23 (POE). Such a sixth side POE 23 has been designed in a new and useful way that yields unexpected superior electrical continuity integrity/shielding effectiveness around both the entire circumference perimeter of the POE 23 and the entire surface area of POE 23, and additionally compresses the POE 23 against the flange 32 so as to achieve metal to metal contact/electrical mating of steel end cap (rear compression plate 39) against steel flange 32 while at the same time meeting the prescribed compression forces required to compress the installed EMI gasket 40 within its associated groove. Such a POE 23 is weatherproof, shockproof, lockable, requires no peripheral power tools or cumbersome fasteners to open/close, and is conducive to rapid and repeated open/close cycles by non-trained/general personnel.

In a non-limiting exemplary embodiment, the compression hatch assembly 24, at the POE 23, serves as an access door to be routinely opened/closed for the purposes of insertion/access/removal of critical electronics designated to be shielded from EMP/IEMP/IEMI within the interior of the housing.

In a non-limiting exemplary embodiment, the electromagnetic shielding enclosure 20 is an EMP/IEMP/IEMI shielding enclosure 20 including a 6-sided metal (or conductive material) outer casing 25, and an inner shielded housing 22 electromagnetically shielded from outside electromagnetic frequencies/pulses when all six sides are conductively (electrically) sealed to one another by welding and/or its achievable equivalent of abutting an appropriately compressed compression hatch assembly 24, having an EMI gasket 40 and metal to metal contact, against a flange 32 of POE 23.

In a non-limiting exemplary embodiment, advantageously, the compression hatch assembly 24 at POE 23 can be routinely opened/closed without compromising the effectiveness of the SE after repeated use. When closed, the electromagnetic shielding enclosure 20 maintains constant high confidence shielding effectiveness (SE) using one-quarter inch steel, flange 32, EMI gasket 40, and generally D-shaped compression pins 27. This structural configuration maintains an effective and superior compression state for the compression hatch assembly 24 that ensures an ongoing and continual electrically conductive, maximum shielding effectiveness with metal to metal mating of flange 32, EMI gasket 40 (mounted in a machined groove), and rear compression plate 39, to the steel flange 32 that is welded to the end of the five-sided steel inner shielded housing 22). Advantageously, such a structural configuration yields a new, useful, and unexpected rugged, on-demand, rapidly deployable enclosure 20 with a POE 23 designed to withstand the unstable environment associated with land vehicles and other mission requirements existing in the field, and additionally, designed for repeated open/close cycles without the need for trained personnel, power tools, inferior fasteners, or inferior clamps.

In a non-limiting exemplary embodiment, the compression hatch assembly 24 at the POE 23 includes several components: a stainless steel end cap (rear compression plate 39) with a welded stud or multiple studs, and electromagnetically insulated (EMI) gasket 40 situated within a machined groove of the rear compression plate 39, a stainless steel machined flat flange 32, a compression foam layer 38 or other suitable compression material serving as a spring with compression force deflection (CFD), an aluminum or steel front compression plate 37, a pre-set nut 35 and associated fastener 36. an aluminum outer casing 25 surrounding the one-quarter inch steel interior faraday shielded housing 22, a plurality of generally D-shaped compression pins 27, an onboard actuating tool 46 for rotating generally D-shaped compression pins 27 between tightened and loosened positions, and an associated stowable lock 47 for preventing the generally D-shaped compression pins 27 from disengaging apertures 58. The compression hatch assembly 24 in combination with the generally D-shaped compression pins 27 provide a 2-stage compression open/close function for the POE 23. Optionally, a handwheel 50 may be employed.

In a non-limiting exemplary embodiment, the generally D-shaped compression pins 27 are rotatably inserted through the apertures 58 of outer casing 25 to hold opposing forces established by the pre-installed pre-set nut 35 (or optional rotatable handwheel 50) and fastener 36 at the compression hatch assembly 24. Thus, opposing forces are then transferred via rotation of generally D-shaped compression pins 27 (or handwheel 50) so that compression hatch assembly 24 is now compressed between the generally D-shaped compression pins 27 and steel flange 32. Compression occurs where the rear compression plate 39 and EMI gasket 40 are compressed against steel flange 32. The compression may have a value ranging from 30-50 psi. Thus, the compression hatch assembly 24 (via handwheel 50 or pre-set nut 35/fastener 36) provides an initial and independent pre-compression function/force before the generally D-shaped compression pins 27 are inserted. Then, the generally D-shaped compression pins 27 are inserted and an additional (supplemental) compression force is exerted against the compression hatch assembly 24 by rotating and pressing the generally D-shaped compression pins 27 against an outer face of the front compression plate 37, thereby providing additional compression force and urging the compression hatch assembly 24 further beyond apertures 58 at the outer casing 25. The non-concentric (generally D-shaped) cross-section of the compression pins 27 urges and presses the compression hatch assembly 24 against flange 32 to maintain a tight seal at POE 23.

In a non-limiting exemplary embodiment, advantageously, the compression hatch assembly 24 provides advantages over competing devices using conventional fasteners/clamps. The compression hatch assembly 24 provides (1) continuous compression over the entire surface area and perimeter of POE 23 thereby eliminating the need for cumbersome fasteners and inferior clamps; (2) exceeds the dynamic performance within the unstable environment of conventional spaced fasteners and clamps by simulating a continuous shockproof weld over the circumference/perimeter of POE 23; (3) suitable clamping structure of equal compression that is unaffected by normal temperature variations, improper torquing, and inadvertent fastener/clamp failure; (4) requires no peripheral power tools to open/close the compression hatch assembly 24; (5) eliminates the time-consuming process of removing/replacing multiple fasteners which can be improperly torqued, thereby allowing for easy on-demand open/close at the POE 23; (6) provides the same high/maximum shielding effectiveness outcome and results of the larger sized (non-portable) POE 23 at a significantly lower cost, lower weight, and lower complexity; (7) suitable for small enclosure POE 23 where hydraulics/pneumatics/other are not a practical method for compressing or pre-compressing POE 23 when compared to the present disclosure's two independent manual compression mechanisms performed via pre-set nut 35/fastener 36 and manual insertion of generally D-shaped compression pins 27; (8) and provides a shock absorbing/impact resistance/outflow valve capability due to the compression foam or compression material serving as a spring with CFD acting as a continuous shock absorber in rugged conditions and/or rapid uncontrolled exterior pressure differentials; and (9) is additionally secured by the generally D-shaped steel compression pins 27 acting as an impact resistant compression lock at chamber 26 while compression hatch assembly 24 is in the closed and sealed position. Additionally, in the event of rapid uncontrolled decompression of the surrounding air, the compression hatch assembly 24 may momentarily open (burp) and then immediately close when interior and exterior pressure is equalized.

Advantageously, the present disclosure provides an ergonomic and effective electromagnetic shielding enclosure 20 that does not require peripheral power tools to open/close compression hatch assembly 24 at POE 23 while effectively yielding the new, useful, and unexpected benefit of a higher confidence, higher integrity, maximized shielding effectiveness POE 23 within both static and unstable environments. The compression hatch assembly 24 at POE 23 provides an obvious superior seal than conventional shielding enclosures using fasteners/clamps. The electromagnetic shielding enclosure 20 provides significantly faster open/close cycles and a superior compression hatch assembly 24 seal at POE 23 upon being tightened and compressed via the generally D-shaped compression pins 27. The electromagnetic shielding enclosure 20 provides a simple, low cost, low weight, manual, and superior compression seal relative to other high cost/high weight enclosures (electric, pneumatic, air bladder, hydraulic, other) designed for large POEs.

In a non-limiting exemplary embodiment, the present disclosure includes a portable electromagnetic shielding enclosure 20 for providing even distribution of compression hatch assembly 24 seal forces at the POE 23 of the inner shielded housing 25. Advantageously, the generally D-shaped compression pins 27 are configured to evenly distribute external forces against the compression hatch assembly 24 and flange 32 at POE 23 after the compression hatch assembly 24 is closed (via rotation of generally D-shaped compression pins 27) from its open, pre-compressed position 45 established by pre-set nut 35/fastener 36 (an optionally handwheel 50). During manufacture of the compression hatch assembly 24, a power tool is used to tighten the pre-set nut 35/fastener 36 to the desired pre-compressed position 45. Then, the compression hatch assembly 24 is positioned at the POE 23 and further tightened (compressed) against flange 32, via rotation of the generally D-shaped compression pins 27. Once the compression pin lock 47/onboard tool 46 is stowed in its proper position, the shielded enclosure 20 is now locked in the sealed/closed position whereby the stainless-steel end cap (rear compression plate 39) and EMI gasket 40 are compressed against the stainless-steel flange 32 along the entirety of the outer perimeter 33 of the POE 23 and the compression pins 78 are restrained from disengagement.

Figure 2:
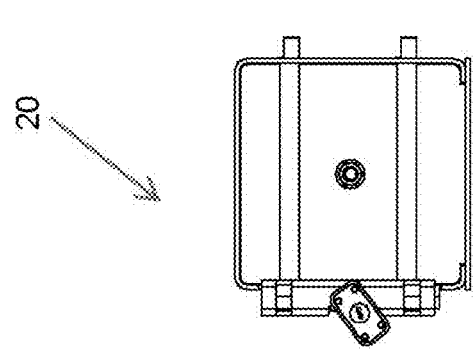
FIG. 2 is a front elevational view of the electromagnetic shielding enclosure shown in FIG. 1.
Figure 3:
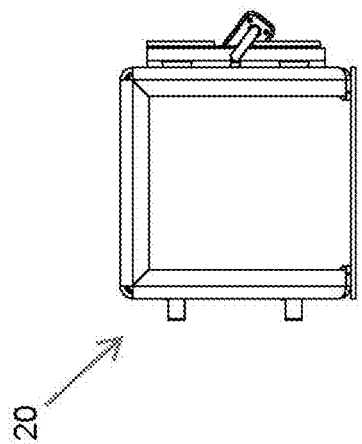
FIG. 3 is a rear elevational view of the electromagnetic shielding enclosure shown in FIG. 1.
Figure 1:
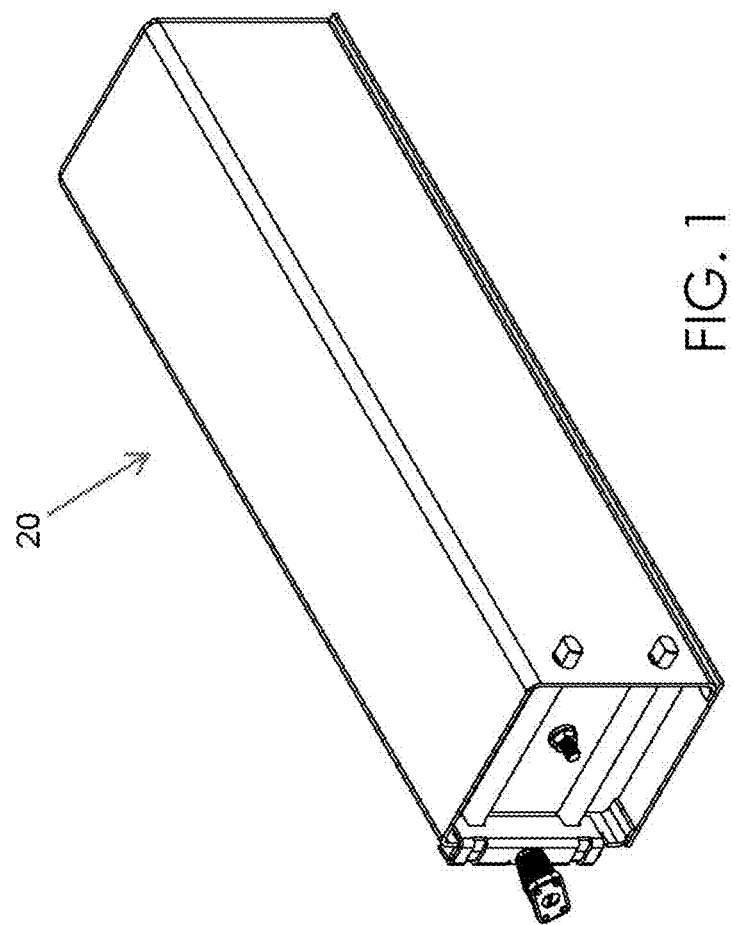
FIG. 1 is a perspective view of an electromagnetic shielding enclosure having a compression hatch point of entry employing rotating generally D-shaped compression pins, in accordance with a non-limiting exemplary embodiment of the present disclosure.
Figure 8:
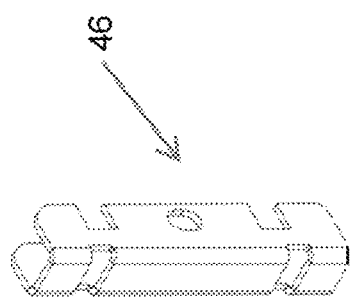
FIG. 8 is an enlarged perspective view of the stowable tool shown in FIG. 1.
Figure 10:
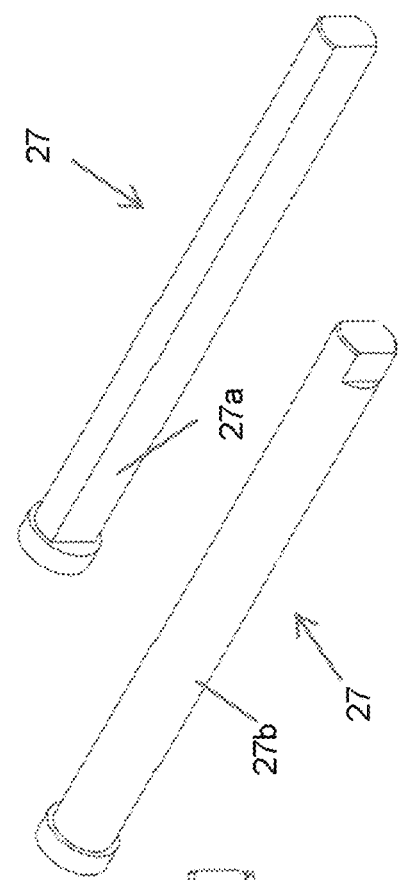
FIG. 10 is a perspective view showing a curvilinear (arcuate) side of the generally D-shaped compression pin shown in FIG. 9.
Figure 11:
FIG. 11 is a perspective view showing a planar (flat) side of the generally D-shaped compression pin shown in FIG. 9.
Figure 9:
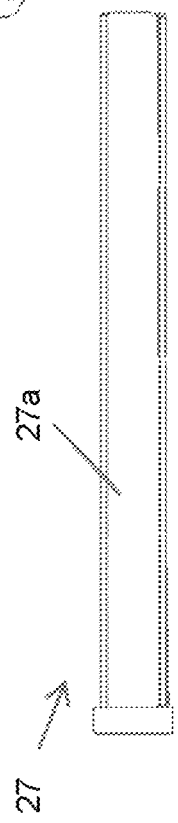
FIG. 9 is an enlarged top plan view showing a planar (flat) side of a generally D-shaped compression pin shown in FIG. 1.
Figure 18:
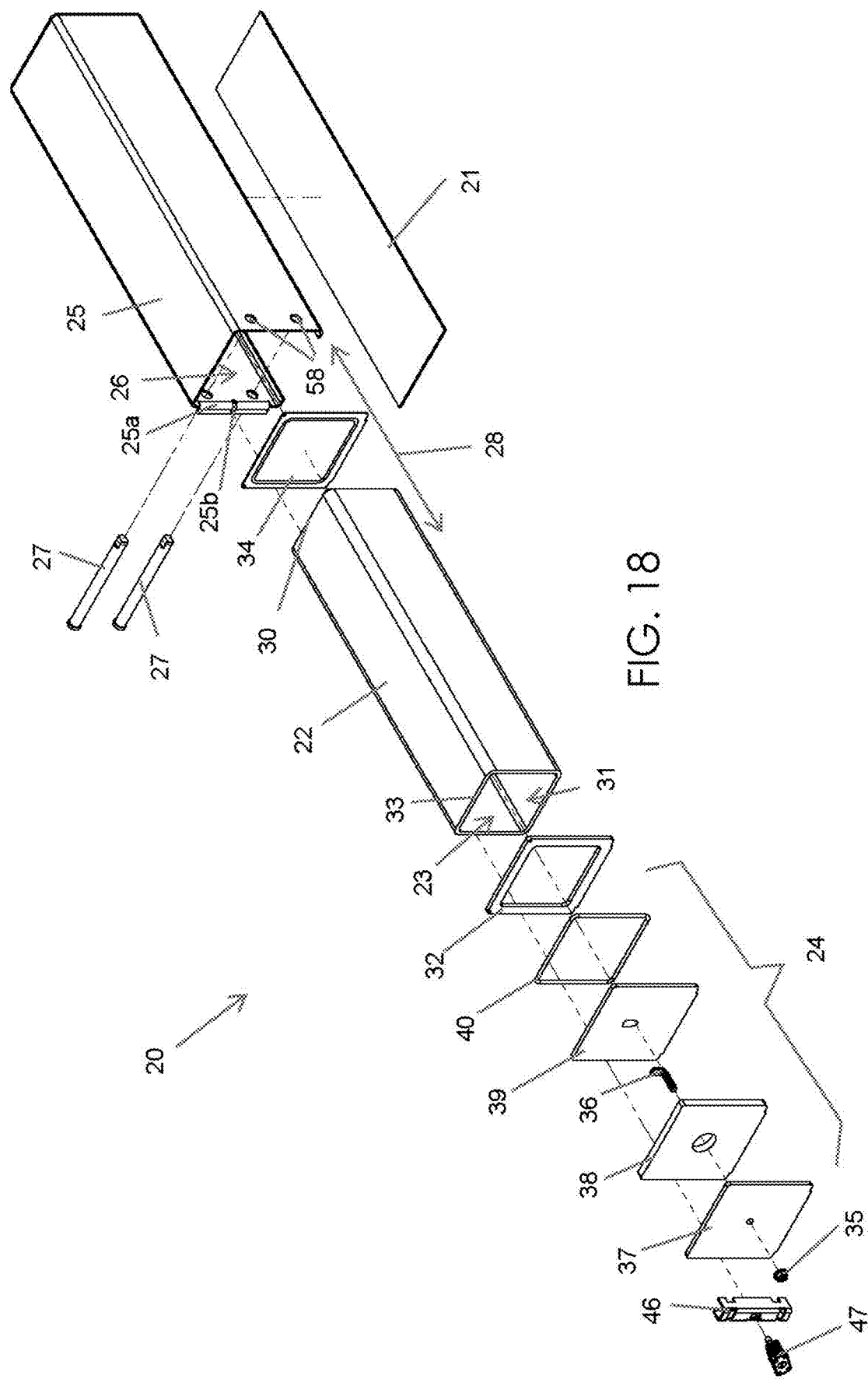
FIG. 18 is fully exploded view of the electromagnetic shielding enclosure shown in FIG. 1.

In a non-limiting exemplary embodiment, referring to FIG. 11, the compression hatch assembly 24 includes a rotatable handle 50 and/or an associated fastener 77 operably coupled thereto, a front compression plate 37 operably coupled to the rotatable handle 50, a compressible foam layer 38 directly engaged with the front compression plate 37, a back stainless steel plate end cap (rear compression plate 39) directly engaged with the compressible foam layer 38, an EMI gasket 40 positioned within a machined groove directly engaged with the back stainless steel plate end cap (rear compression plate) 39, and a machined flat, stainless steel flange 32 welded to the inner shielded enclosure 20. Advantageously, the initial pre-compression function is achieved via rotation of the rotatable handle 50 in opposed rotational directions to tighten and loosen the axial compression force between the front compression plate 37 and the back stainless steel end cap (rear compression plate 39). Once the pre-compressed hatch assembly 24 is installed into the chamber 26 at its proper depth, set against the flange 32, and compression pins 78 are installed, the pre-compression force is then transferred by loosening the handwheel 50 and/or rotating compression pins 78, thereby transferring the opposing forces between the compression/clevis pins 78 and the stainless steel flange 32. The shielded enclosure 20 is now locked in the sealed/closed position whereby the stainless-steel end cap (rear compression plate 39) and EMI gasket 40 are compressed against the stainless-steel flange 32 along the entirety of the outer perimeter 33 of the POE 23.

FIG. 20 is a graph illustrating experimental testing results wherein the FARASAFE.TM enclosure 20 employed its compression hatch assembly 24 vs. BOEING.RTM Little Mountain Testing Facility's (LMTF) blank steel plate (panel) in a radiated susceptibility, transient electromagnetic field (RS105) screen room at LMTF. The mounting of the compression hatch assembly 24 is suitable to bring the shielding effectiveness of the RS105 screen room back into compliance to the requirements of high-altitude electromagnetic pulse (HEMP) protection for fixed ground-based facilities performing critical, time-urgent missions (MIL-STD-188-125-1A). The test concentrated on the area of the compression hatch assembly 24. Replacing the LMTF blank steel plate with the compression hatch assembly 24 from SAFESTATE.TM brought the effectiveness of the continuous wave shielding of the RS105 screen room back into compliance with MIL-STD-188-125-1A. In the end, the compression hatch assembly 24 was removed and the LMTF one-eighth inches thick blank steel plate (panel) was re-installed and tested for SE of the RS105 screen room and for the comparison between FARASAFE.TM hatch compression assembly 24 and LMTF blank steel plate (panel). The compression hatch assembly 24 closed configuration met all the requirements of MIL-STD-188-125-1A for the area of concern. All SE test frequencies for all antennas in both antenna polarities showed above the MIL-STD-188-125-1A pass/fail limit line 81.

While various embodiments have been described, the description is intended to be exemplary, rather than limiting, and it is understood that many more embodiments and implementations are possible that are within the scope of the embodiments. Although many possible combinations of features are shown in the accompanying figures and discussed in this detailed description, many other combinations of the disclosed features are possible. Any feature of any embodiment may be used in combination with or substituted for any other feature or element in any other embodiment unless specifically restricted. Therefore, it will be understood that any of the features shown and/or discussed in the present disclosure may be implemented together in any suitable combination. Accordingly, the embodiments are not to be restricted except in light of the attached claims and their equivalents. Also, various modifications and changes may be made within the scope of the attached claims.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various examples for the purpose of streamlining the disclosure. This method of disclosure is not to be interpreted as reflecting an intention that the claims require more features than are expressly recited in each claim. Rather, as the following claims reflect, inventive subject matter lies in less than all features of a single disclosed example. Thus, the following claims are hereby incorporated into the Detailed Description, with each claim standing on its own as a separately claimed subject matter.

What is claimed as new and what is desired to secure by Letters Patent of the United States is:

1. A portable electromagnetic shielding enclosure for providing even distribution of seal forces, said portable electromagnetic shielding enclosure comprising:
   a portable inner shielded housing having an open point of entry;
   a compression hatch assembly coupled to said open point of entry and being configured to electromagnetically seal said open point of entry;
   a portable bottom plate and a portable outer casing affixed to said portable bottom plate and being configured to define a chamber configured to receive said portable inner shielded housing; and
   a plurality of compression pins removably abutted with said compression hatch assembly and said portable outer casing;
   wherein said compression hatch assembly and said portable inner shielded housing are reciprocated, along a bi-directional travel path, into and out from said chamber;
   wherein said compression pins are configured to evenly distribute external forces against said compression hatch assembly operably engaged with said open point of entry after said compression hatch assembly is closed and locked from its open and manually pre-compressed position.

2. The portable electromagnetic shielding enclosure of claim 1, wherein said portable inner shielded housing further comprises:
   a rear side;
   an axial bore;
   a flange disposed about said axial bore at an outer perimeter of said open point of entry; and
   a rear plate attached to said rear side;
   wherein said compression hatch assembly is operably engaged with said flange and axially opposed from said rear plate.

3. The portable electromagnetic shielding enclosure of claim 2, wherein said compression hatch assembly comprises:
   a preset nut and a fastener operably coupled thereto;
   a front compression plate operably coupled to said preset nut;
   a compressible foam layer directly engaged with said front compression plate;
   a rear compression plate directly engaged with said compressible foam layer and said fastener; and
   an electromagnetically insulated (EMI) gasket directly engaged with said rear compression plate and said flange;
   wherein said pre-set nut and said fastener are configured to establish a fixed, pre-harnessed compression state suitable for said compression hatch assembly to operably and electromagnetically seal said point of entry;
wherein said compression hatch assembly and said portable inner shielded housing are further configured to be contemporaneously inserted into said portable outer casing.

4. The portable electromagnetic shielding enclosure of claim 3, wherein said portable electromagnetic shielding enclosure further comprises:
a stowable tool removably engaged with said compression pins as well as said portable outer casing; and
a lock detachably engaged with said stowable tool and said portable outer casing.

5. The portable electromagnetic shielding enclosure of claim 4, wherein said stowable tool and said lock are located exterior of said portable inner shielded housing and said portable outer casing.

6. The portable electromagnetic shielding enclosure of claim 5, wherein said compression pins comprise: a plurality of generally D-shaped compression pins configured to roll and transfer opposing forces that compresses said EMI gasket against said flange along an entirety of said outer perimeter of said point of entry at said portable inner shielded housing.

7. The portable electromagnetic shielding enclosure of claim 3, wherein said portable electromagnetic shielding enclosure further comprises: a rotating handle operably engaged with said pre-set nut.

8. The portable electromagnetic shielding enclosure of claim 7, wherein said rotating handle is configured to be rotated in opposed rotational directions to respectively tighten and loosen said pre-set nut and further configured to enable said compression hatch assembly to be inserted into said chamber.

9. The portable electromagnetic shielding enclosure of claim 1, wherein said compression hatch assembly, said portable inner shielded housing, and said portable outer casing are coaxially aligned.

10. A portable electromagnetic shielding enclosure for providing even distribution of seal forces, said portable electromagnetic shielding enclosure comprising:
a portable inner shielded housing having an open point of entry;
a compression hatch assembly operably coupled to said open point of entry and being configured to electromagnetically seal said open point of entry;
a portable bottom plate and a portable outer casing affixed to said portable bottom plate and being configured to define a chamber configured to linearly receive said portable inner shielded housing; and
a plurality of compression pins frictionally and removably abutted with said compression hatch assembly and said portable outer casing;
wherein said compression hatch assembly and said portable inner shielded housing are axially reciprocated, along a bi-directional travel path, into and out from said chamber;
wherein said compression pins are configured to evenly distribute external forces against said compression hatch assembly operably engaged with said open point of entry after said compression hatch assembly is closed and locked from its open and manually pre-compressed position.

11. The portable electromagnetic shielding enclosure of claim 10, wherein said portable inner shielded housing further comprises:
a rear side;
an axial bore;
a flange disposed about said axial bore at an outer perimeter of said open point of entry; and
a rear plate attached to said rear side;
wherein said compression hatch assembly is operably engaged with said flange and axially opposed from said rear plate.

12. The portable electromagnetic shielding enclosure of claim 11, wherein said compression hatch assembly comprises:
a preset nut and a fastener operably coupled thereto;
a front compression plate operably coupled to said preset nut;
a compressible foam layer directly engaged with said front compression plate;
a rear compression plate directly engaged with said compressible foam layer and said fastener; and
an electromagnetically insulated (EMI) gasket directly engaged with said rear compression plate and said flange;
wherein said pre-set nut and said fastener are configured to establish a fixed, pre-harnessed compression state suitable for said compression hatch assembly to operably and electromagnetically seal said point of entry;
wherein said compression hatch assembly and said portable inner shielded housing are further configured to be contemporaneously inserted into said portable outer casing.

13. The portable electromagnetic shielding enclosure of claim 12, wherein said portable electromagnetic shielding enclosure further comprises:
a stowable tool removably engaged with said compression pins as well as said portable outer casing; and
a lock detachably engaged with said stowable tool and said portable outer casing.

14. The portable electromagnetic shielding enclosure of claim 13, wherein said stowable tool and said lock are located exterior of said portable inner shielded housing and said portable outer casing.

15. The portable electromagnetic shielding enclosure of claim 14, wherein said compression pins comprise: a plurality of generally D-shaped compression pins configured to roll and transfer opposing forces that compresses said EMI gasket against said flange along an entirety of said outer perimeter of said point of entry at said portable inner shielded housing.

16. The portable electromagnetic shielding enclosure of claim 12, wherein said portable electromagnetic shielding enclosure further comprises: a rotating handle operably engaged with said pre-set nut.

17. The portable electromagnetic shielding enclosure of claim 16, wherein said rotating handle is configured to be rotated in opposed rotational directions to respectively tighten and loosen said pre-set nut and further configured to enable said compression hatch assembly to be inserted into said chamber.

18. The portable electromagnetic shielding enclosure of claim 10, wherein said compression hatch assembly, said portable inner shielded housing, and said portable outer casing are coaxially aligned.

* * * * *